(12) United States Patent
Kagawa et al.

(10) Patent No.: US 11,271,074 B2
(45) Date of Patent: Mar. 8, 2022

(54) CAPACITOR AND METHOD FOR MANUFACTURING THE SAME

(71) Applicant: Murata Manufacturing Co., Ltd., Nagaokakyo (JP)

(72) Inventors: Takeshi Kagawa, Nagaokakyo (JP); Masatomi Harada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/038,593

(22) Filed: Sep. 30, 2020

(65) Prior Publication Data
US 2021/0020738 A1    Jan. 21, 2021

Related U.S. Application Data

(63) Continuation of application No. PCT/JP2019/015404, filed on Apr. 9, 2019.

(30) Foreign Application Priority Data

Apr. 18, 2018 (JP) .............................. JP2018-079826

(51) Int. Cl.
*H01L 49/02* (2006.01)

(52) U.S. Cl.
CPC .............. *H01L 28/75* (2013.01); *H01L 28/55* (2013.01); *H01L 28/82* (2013.01); *H01L 28/84* (2013.01); *H01L 28/92* (2013.01)

(58) Field of Classification Search
CPC ......... H01L 21/76838; H01L 21/76805; H01L 21/76877; H01L 28/82; H01L 28/84;
(Continued)

(56) References Cited

U.S. PATENT DOCUMENTS

RE38,383 E * 1/2004 Choi ................. H01L 21/76814
257/763
9,711,283 B2    7/2017 Namikawa et al.
(Continued)

FOREIGN PATENT DOCUMENTS

| JP | 2015216246 A | 12/2015 |
| JP | 2017195321 A | 10/2017 |
| WO | 2018003445 A1 | 1/2018 |

OTHER PUBLICATIONS

International Search Report issued for PCT/JP2019/015404, dated Jul. 2, 2019.
(Continued)

*Primary Examiner* — Jose R Diaz
(74) *Attorney, Agent, or Firm* — Arent Fox LLP

(57) ABSTRACT

A capacitor having a substrate, a first electrode layer, a dielectric layer, a second electrode layer, and first and second outer electrodes. The substrate has a first main surface and a second main surface opposite to the first main surface. The first electrode layer is on the first main surface of the substrate. The dielectric layer is on at least part of the first electrode layer. The second electrode layer is on at least part of the dielectric layer. The first outer electrode is electrically connected to the first electrode layer and the second outer electrode is electrically connected to the second electrode layer. At least one of the first electrode layer and the first outer electrode and the second electrode layer and the second outer electrode are in contact with each other at a first contact surface. The first contact surface includes a first uneven surface portion.

18 Claims, 8 Drawing Sheets

(58) Field of Classification Search
CPC ......... H01L 28/92; H01L 28/75; H01L 28/55; H01L 55/84
See application file for complete search history.

(56) References Cited

U.S. PATENT DOCUMENTS

2015/0325368 A1   11/2015   Namikawa et al.
2019/0122820 A1   4/2019    Harada et al.

OTHER PUBLICATIONS

Written Opinion of the International Searching Authority issued for PCT/JP2019/015404, dated Jul. 2, 2019.

* cited by examiner

CAPACITOR AND METHOD FOR MANUFACTURING THE SAME

CROSS REFERENCE TO RELATED APPLICATIONS

The present application is a continuation of International application No. PCT/JP2019/015404, filed Apr. 9, 2019, which claims priority to Japanese Patent Application No. 2018-079826, filed Apr. 18, 2018, the entire contents of each of which are incorporated herein by reference.

FIELD OF THE INVENTION

The present invention relates to a capacitor and a method for manufacturing the same, and more particularly, to a thin film capacitor and a method for manufacturing the same.

BACKGROUND OF THE INVENTION

Japanese Unexamined Patent Application Publication No. 2015-216246 (Patent Document 1) is a prior art document disclosing a configuration of a capacitor. The capacitor described in Patent Document 1 is a thin film capacitor, and includes a laminate in which a dielectric layer and an upper electrode layer are sequentially laminated on a base electrode, a protective layer, and terminal electrodes. The protective layer covers at least the dielectric layer and the upper electrode layer, and has through-holes on the base electrode and the upper electrode layer. A first terminal electrode is electrically connected to the base electrode through a first through-hole in the protective layer, and a second terminal electrode is electrically connected to the upper electrode layer through a second through-hole in the protective layer.

SUMMARY OF THE INVENTION

In recent years, there has been a demand for a smaller capacitor than in the related art. When the capacitor described in Patent Document 1 is reduced in size, a contact surface between the terminal electrode and the base electrode, and a contact surface between the terminal electrode and the upper electrode layer are reduced in area, and contact resistance is increased. As the contact resistance increases, equivalent series resistance (ESR) of the capacitor increases, and a Q value of the capacitor decreases.

The present invention has been made in view of the above-described problems, and an object thereof is to provide a capacitor for which contact resistance is decreased to reduce ESR, and a Q value is increased, and a method for manufacturing the capacitor.

A capacitor based on the present invention includes a substrate, a first electrode layer, a dielectric layer, a second electrode layer, and first and second outer electrodes. The substrate has a first main surface, and a second main surface on a side thereof opposite to the first main surface, and the first electrode layer is on a side of the first main surface of the substrate. The dielectric layer is on at least part of the first electrode layer. The second electrode layer is on at least part of the dielectric layer. The first outer electrode is electrically connected to the first electrode layer, and the second outer electrode is electrically connected to the second electrode layer. At least one of (1) the first electrode layer and the first outer electrode and (2) the second electrode layer and the second outer electrode are in contact with each other at a first contact surface, and the first contact surface includes a first uneven surface portion.

According to the present invention, it is possible to decrease contact resistance to reduce ESR, and to increase a Q value of a capacitor.

DETAILED DESCRIPTION OF THE PREFERRED EMBODIMENTS

Figure 1:
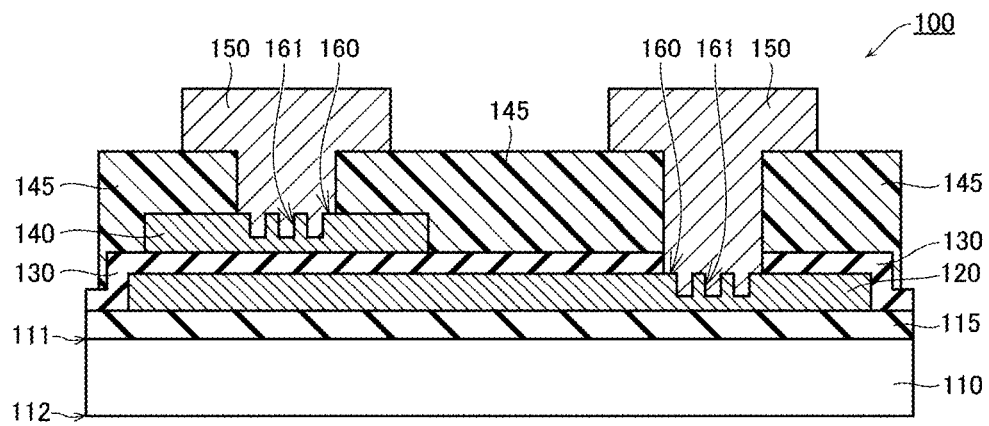
FIG. 1 is a sectional view of a capacitor according to Embodiment 1 of the present invention.

Hereinafter, a capacitor according to each embodiment of the present invention will be described with reference to the drawings. In the following description of the embodiments, the same or corresponding parts in the drawings are denoted by the same reference symbols, and description thereof will not be repeated.

Embodiment 1

Figure 2:
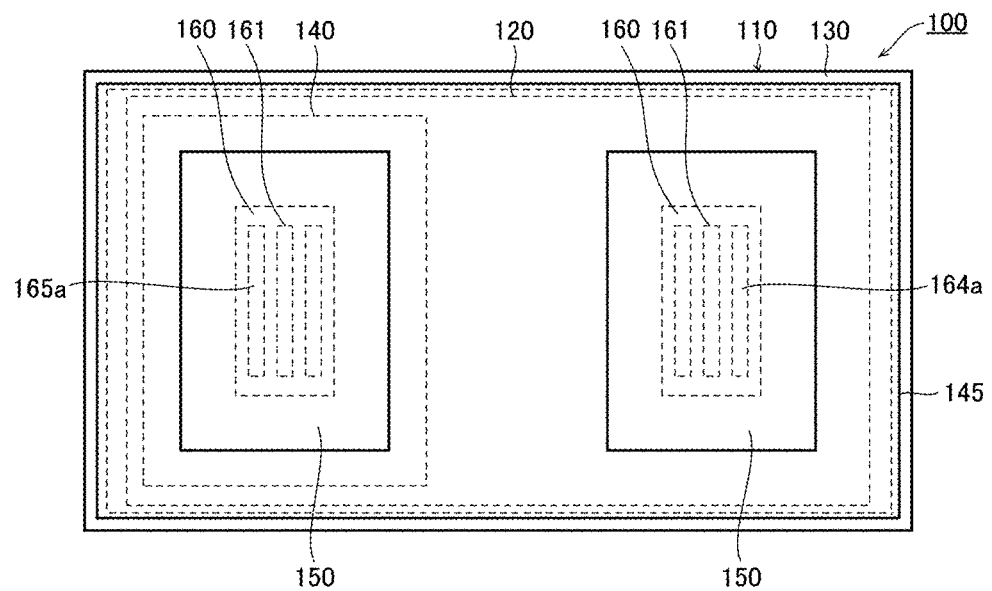
FIG. 2 is a plan view of the capacitor according to Embodiment 1 of the present invention as viewed from a side of an outer electrode.

FIG. 1 is a sectional view of a capacitor according to Embodiment 1 of the present invention. FIG. 2 is a plan view of the capacitor according to Embodiment 1 of the present invention as viewed from a side of an outer electrode. In FIG. 2, an internal configuration of the capacitor is indicated by dotted lines.

As illustrated in FIG. 1 and FIG. 2, a capacitor 100 according to Embodiment 1 of the present invention includes a substrate 110, a first electrode layer 120, a dielectric layer 130, a second electrode layer 140, and outer electrodes 150.

The substrate 110 has a first main surface 111, and a second main surface 112 located on a side thereof opposite to the first main surface 111. As illustrated in FIG. 2, the substrate 110 has a rectangular outer shape having a long side in a direction in which the two outer electrodes 150 are arranged when the capacitor 100 is viewed from the side of the outer electrode. The above rectangular shape has, for example, the long side having a length of 200 μm to 600 μm, and a short side having a length of 100 μm to 300 μm. Note that, when a method for manufacturing the capacitor 100 according to the present embodiment includes a back grinding step described later, the thickness of the substrate 110 before being ground in the back grinding step is preferably 500 μm to 700 μm. The thickness of the substrate 110 referred to herein refers to the thickness of the substrate 110 in a direction perpendicular to the first main surface 111.

The substrate 110 is preferably made of a semiconductor material such as silicon or gallium arsenide, or an insulating material such as glass or alumina.

In the present embodiment, as illustrated in FIG. 1, an insulating layer 115 is laminated over an entire surface of the first main surface 111 of the substrate 110.

The thickness of the insulating layer 115 is not particularly limited as long as the thickness is enough for the substrate 110 in the capacitor 100 to be electrically insulated from other constituent members by the insulating layer 115. The thickness of the insulating layer 115 is preferably equal to or larger than 0.1 μm.

The material of the insulating layer 115 is not particularly limited, but the insulating layer 115 is preferably formed of an insulating material such as $SiO_2$, SiN, $Al_2O_3$, $HfO_2$, $Ta_2O_5$, or $ZrO_2$.

Note that, when the material of the substrate 110 is an insulating material such as glass or alumina, the capacitor 100 does not need to include the insulating layer 115. When the capacitor 100 does not include the insulating layer 115, a member laminated on the insulating layer 115 is directly laminated on the substrate 110.

The first electrode layer 120 is located on a side of the first main surface of the substrate 110. In the present embodiment, the first electrode layer 120 is laminated on part of the insulating layer 115 that is laminated on the substrate 110. As illustrated in FIG. 2, when the capacitor 100 is viewed from the side of the outer electrode, a peripheral edge of the first electrode layer 120 is located along an inner side of a peripheral edge of the substrate 110.

The thickness of the first electrode layer 120 is not particularly limited, but is preferably 0.5 μm to 10 μm, and more preferably 2 μm to 6 μm.

The material of the first electrode layer 120 is not particularly limited as long as the material is a conductive material, and the first electrode layer 120 is preferably made of metals such as Cu, Ag, Au, Al, Pt, Ni, Cr, or Ti, or an alloy containing at least one of the metals.

The dielectric layer 130 is laminated on part of the first electrode layer 120. As illustrated in FIG. 1, the dielectric layer 130 is laminated so as to extend also to a part of the insulating layer 115 where the first electrode layer 120 is not laminated on the insulating layer 115.

The thickness of the dielectric layer 130 is adjusted according to electrostatic capacity required for the capacitor 100, and is not particularly limited, but is preferably 0.1 μm to 1.5 μm.

The material of the dielectric layer 130 is not particularly limited, but the dielectric layer 130 is preferably formed of an oxide such as $SiO_2$, $Al_2O_3$, $HfO_2$, $Ta_2O_5$, or $ZrO_2$, or a nitride such as SiN.

As illustrated in FIG. 1, the second electrode layer 140 is laminated on part of the dielectric layer 130 so as to face the first electrode layer 120 with the dielectric layer 130 interposed therebetween.

The thickness of the second electrode layer 140 is not particularly limited, but is preferably 0.5 μm to 10 μm, and more preferably 2 μm to 6 μm.

The material of the second electrode layer 140 is not particularly limited as long as the material is a conductive material, and the second electrode layer 140 is preferably made of metals such as Cu, Ag, Au, Al, Pt, Ni, Cr, or Ti, or alloy containing at least one of the metals.

The capacitor 100 according to the present embodiment further includes a protective layer 145. As illustrated in FIG. 1, the protective layer 145 is laminated on part of the dielectric layer 130 on a side thereof opposite to the substrate 110, and on part of the second electrode layer 140. As illustrated in FIG. 2, when the capacitor 100 is viewed from the side of the outer electrode, the peripheral edge of the protective layer 145 is located between the peripheral edge of the substrate 110 and the peripheral edge of the first electrode layer 120.

The thickness of the protective layer 145 is not particularly limited, but is preferably 1 μm to 20 μm.

The material of the protective layer 145 is not particularly limited, but the protective layer 145 is preferably made of a resin material such as polyimide.

Further, a moisture-resistant layer may be laminated, between the protective layer 145 and each of the dielectric layer 130 and the second electrode layer 140. The material of the moisture-resistant layer is not particularly limited, but the moisture-resistant layer is preferably made of SiN or the like.

The outer electrodes 150 correspond and connect, respectively, to each of the first electrode layer 120 and the second electrode layer 140. As illustrated in FIG. 1, a first of the outer electrodes 150 connected to the first electrode layer 120 is laminated on a part of the first electrode layer 120 where the dielectric layer 130 is not laminated. A second of the outer electrodes 150 connected to the second electrode layer 140 is laminated on a part of the second electrode layer 140 where the protective layer 145 is not laminated.

Further, the outer electrodes 150 are also laminated on part of the protective layer 145. As illustrated in FIG. 2, when the capacitor 100 is viewed from the side of the outer electrodes, the outer electrode 150 laminated on the first electrode layer 120 is surrounded by the outer electrode 150 laminated on the part of the protective layer 145, and the outer electrode 150 laminated on the second electrode layer 140 is surrounded by the outer electrode 150 laminated on the part of the protective layer 145.

The material of the outer electrode 150 is not particularly limited as long as the material is a conductive material, but the outer electrode 150 is preferably made of metals such as Cu, Ni, Ag, Au, or Al, or alloy containing at least one of the metals. The material making the outer electrode 150 is preferably a material having a lower resistivity than that of each of the first electrode layer 120 and the second electrode layer 140. In addition, in view of a fact that the capacitor 100 can be mounted by soldering, at least part of a surface on a side opposite to a substrate side of the outer electrode 150 is preferably made of Au or Sn.

The entire thickness of the capacitor 100 according to the present embodiment is preferably 10 μm to 300 μm. The entire thickness of the capacitor 100 refers to a thickness from the second main surface 112 of the substrate 110 to a surface of the outer electrode on a side opposite to the substrate 110.

As illustrated in FIG. 1, at least one of the first electrode layer 120 and the second electrode layer 140, and the outer electrodes 150 are in contact with each other at a first contact surface 160. The first contact surface 160 includes a first uneven surface portion 161. In the present embodiment, each of the first contact surface 160 between the first electrode layer 120 and the outer electrode 150, and the first contact surface 160 between the second electrode layer 140 and the outer electrode 150 includes the first uneven surface portion 161.

As illustrated in FIG. 1, the first uneven surface portion 161 is constituted by a plurality of recessed portions formed in the first electrode layer 120 or the second electrode layer 140, but may be constituted by a plurality of protruding portions formed on the first electrode layer 120 or the second electrode layer 140. Note that, the width of each of the plurality of recessed portions constituting the first uneven surface portion 161 is preferably equal to or larger than 3 μm. This is because, when the width of each of the plurality of recessed portions is smaller than 3 μm, there is a possibility that a defect occurs in a film forming process during formation of the outer electrode 150.

The depth of each of the plurality of recessed portions constituting the first uneven surface portion 161 is preferably 0.2 μm to 2 μm. In addition, the depth of each of the plurality of recessed portions constituting the first uneven surface portion 161 is preferably equal to or smaller than 0.5 times the thickness of each of the first electrode layer 120 and the second electrode layer 140. Note that, when an uneven surface portion is formed of a plurality of protruding portions, a depth of each of the plurality of recessed portions corresponds to a height of each of the plurality of protruding portions.

In the present embodiment, the first uneven surface portion 161 of the first contact surface 160 between the first electrode layer 120 and the outer electrode 150 has a first uneven pattern 164a, and the first uneven surface portion 161 of the first contact surface 160 between the second electrode layer 140 and the outer electrode 150 has a second uneven pattern 165a. As illustrated in FIG. 2, when the capacitor 100 is viewed from the side of the outer electrodes 150, each of the first uneven pattern 164a and the second uneven pattern 165a is formed of a plurality of rectangular shapes. Note that, when the capacitor 100 is viewed from the side of the outer electrodes 150, corner portions of each of the first uneven pattern 164a and the second uneven pattern 165a are each preferably rounded.

Each of the above plurality of rectangular shapes in the first uneven pattern 164a is formed by an outer shape of each of the plurality of recessed portions formed in the first electrode layer 120 constituting the first uneven surface portion 161. Each of the above plurality of rectangular shapes in the second uneven pattern 165a is constituted by an outer shape of each of the plurality of recessed portions formed in the second electrode layer 140 constituting the first uneven surface portion 161.

Note that, in the present embodiment, since the entire thickness of the capacitor 100 falls within the above range, and the outer electrodes 150 are made of the above-described material, each of the first uneven pattern 164a and the second uneven pattern 165a is visible through the outer electrodes 150.

Each of the first uneven pattern 164a and the second uneven pattern 165a may be configured to have a shape different from that of the above-described shape. Here, the capacitor 100 according to each modified example of Embodiment 1 of the present invention will be described.

Figure 3:
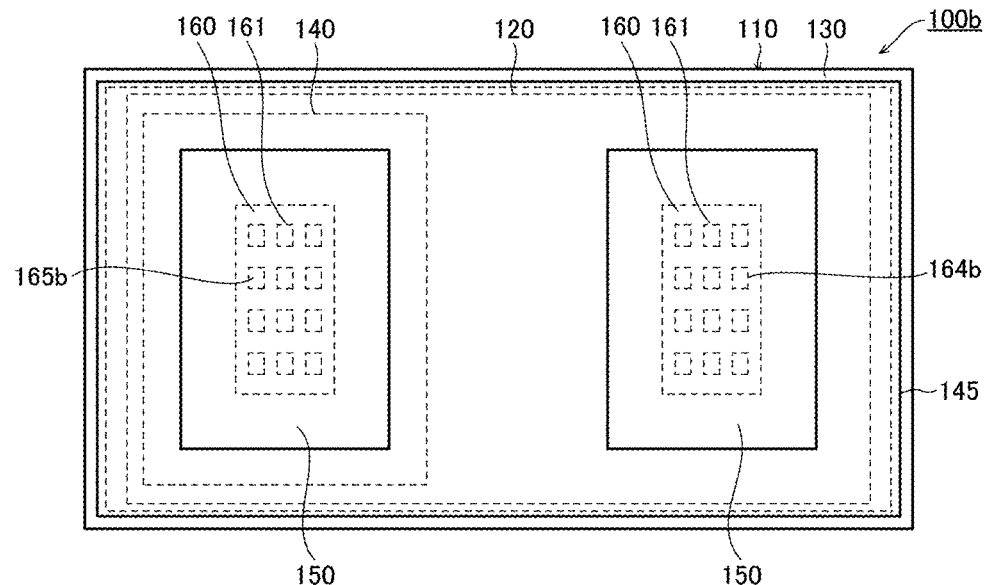
FIG. 3 is a plan view of a capacitor according to a first modified example of Embodiment 1 of the present invention as viewed from a side of an outer electrode.
Figure 4:
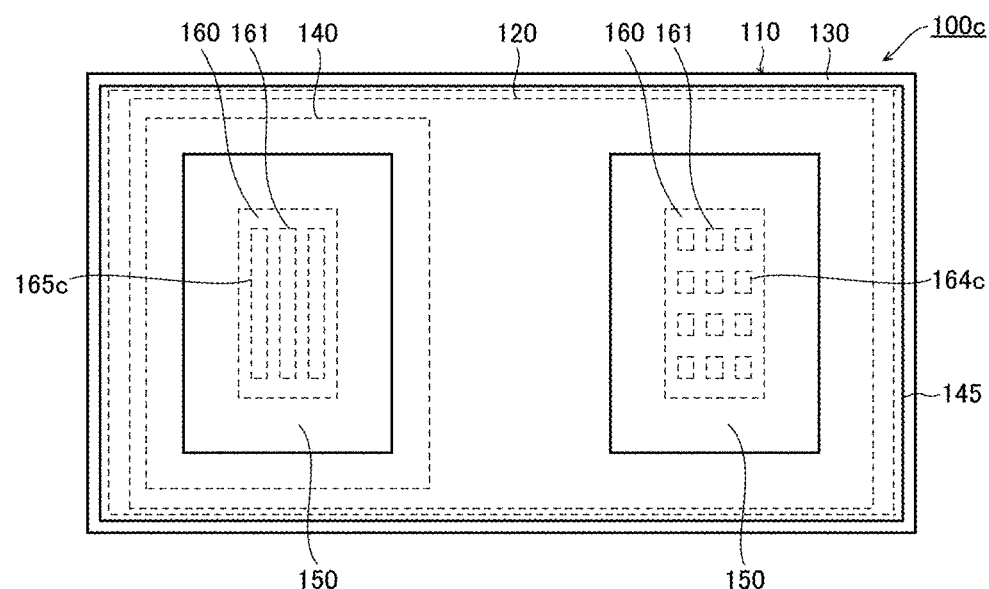
FIG. 4 is a plan view of a capacitor according to a second modified example of Embodiment 1 of the present invention as viewed from a side of an outer electrode.

FIG. 3 is a plan view of a capacitor according to a first modified example of Embodiment 1 of the present invention as viewed from a side of the outer electrodes. FIG. 4 is a plan view of a capacitor according to a second modified example of Embodiment 1 of the present invention as viewed from a side of the outer electrodes. In each of FIG. 3 and FIG. 4, an internal configuration of the capacitor is indicated by dotted lines.

As illustrated in FIG. 3, when a capacitor 100*b* according to the first modified example of Embodiment 1 of the present invention is viewed from the side of the outer electrode, each of a first uneven pattern 164*b* and a second uneven pattern 165*b* is formed of a plurality of substantially square shapes. Each of the above plurality of substantially square shapes in the first uneven pattern 164*b* is formed by an outer shape of each of the plurality of recessed portions formed in the first electrode layer 120 constituting the first uneven surface portion 161. Each of the above plurality of substantially square shapes in the second uneven pattern 165*b* is formed by an outer shape of each of the plurality of recessed portions formed in the second electrode layer 140 constituting the first uneven surface portion 161.

As illustrated in FIG. 4, in a capacitor 100*c* according to the second modified example of Embodiment 1 of the present invention, a first uneven pattern 164*c* is different from a second uneven pattern 165*c*. Respective specific patterns of the first uneven pattern 164*c* and the second uneven pattern 165*c* in the present embodiment are not particularly limited. For example, as illustrated in FIG. 4, when the capacitor 100*c* according to the present embodiment is viewed from a side of the outer electrodes, the first uneven pattern 164*c* is the same as the first uneven pattern 164*b* of the capacitor 100*b* according to the first modified example of Embodiment 1, and the second uneven pattern 165*c* is the same as the second undulating pattern 165*a* of the capacitor 100 according to Embodiment 1.

In the capacitor 100*c* according to the second modified example of Embodiment 1 of the present invention, the first uneven pattern 164*c* is different from the second uneven pattern 165*c*, and each of the first uneven pattern 164*c* and the second uneven pattern 165*c* is visible through the outer electrodes 150. Thus, the outer electrode 150 connected to the first electrode layer 120 and the outer electrode 150 connected to the second electrode layer 140 can be easily distinguished from each other from an external appearance of the capacitor 100*c*.

Hereinafter, a method for manufacturing the capacitor according to Embodiment 1 of the present invention will be described.

Figure 5:
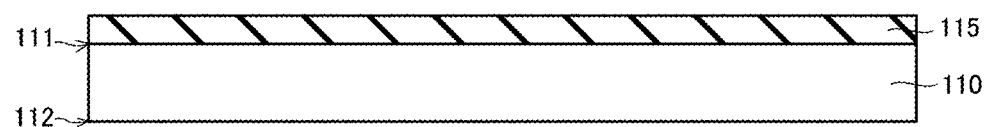
FIG. 5 is a sectional view illustrating a state in which an insulating layer is provided on a first main surface of a substrate, in a method for manufacturing the capacitor according to Embodiment 1 of the present invention.

FIG. 5 is a sectional view illustrating a state in which the insulating layer is provided on the first main surface of the substrate, in the method for manufacturing the capacitor according to Embodiment 1 of the present invention. As illustrated in FIG. 5, the insulating layer 115 is provided on the first main surface 111 of the substrate 110 by a CVD method, a PVD method, or the like.

Figure 6:
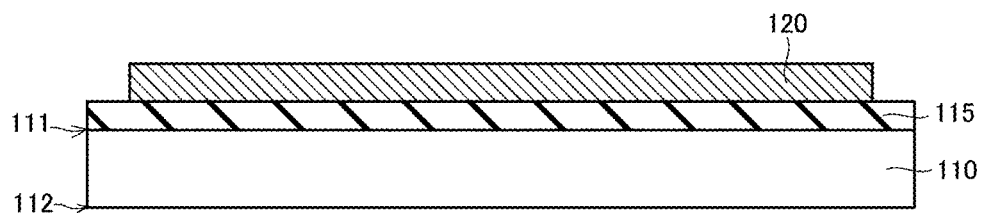
FIG. 6 is a sectional view illustrating a state in which a first electrode layer is provided on the insulating layer, in the method for manufacturing the capacitor according to Embodiment 1 of the present invention.

FIG. 6 is a sectional view illustrating a state in which the first electrode layer is provided on the insulating layer, in the method for manufacturing the capacitor according to Embodiment 1 of the present invention. As illustrated in FIG. 6, the first electrode layer 120 is provided on a side opposite to a substrate side of the insulating layer 115, by a lift-off method, a plating method, an etching method, or the like. That is, when the capacitor according to Embodiment 1 of the present invention is manufactured, the first electrode layer 120 is provided on a side of the first main surface of the substrate 110.

Figure 7:
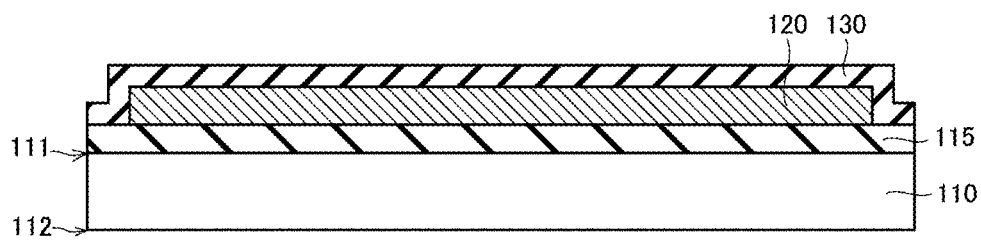
FIG. 7 is a sectional view illustrating a state in which a dielectric layer is provided on the first electrode layer, in the method for manufacturing the capacitor according to Embodiment 1 of the present invention.

FIG. 7 is a sectional view illustrating a state in which the dielectric layer is provided on the first electrode layer, in the method for manufacturing the capacitor according to Embodiment 1 of the present invention. As illustrated in FIG. 7, the dielectric layer 130 is provided on an entire surface on a side opposite to a substrate side of the first electrode layer 120, a peripheral portion of the first electrode layer 120, and a surface of the insulating layer 115 on which the first electrode layer 120 is not provided, by a CVD method, a PVD method, or the like.

Figure 8:
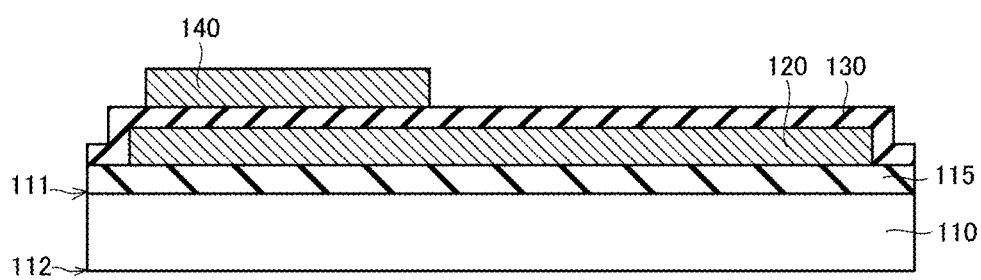
FIG. 8 is a sectional view illustrating a state in which a second electrode layer is provided on the dielectric layer in the method for manufacturing the capacitor according to Embodiment 1 of the present invention.

FIG. 8 is a sectional view illustrating a state in which the second electrode layer is provided on the dielectric layer, in the method for manufacturing the capacitor according to Embodiment 1 of the present invention. As illustrated in FIG. 8, the second electrode layer 140 is provided on part of the dielectric layer 130 on a side thereof opposite to a substrate side, by a lift-off method, a plating method, an etching method, or the like.

Figure 9:
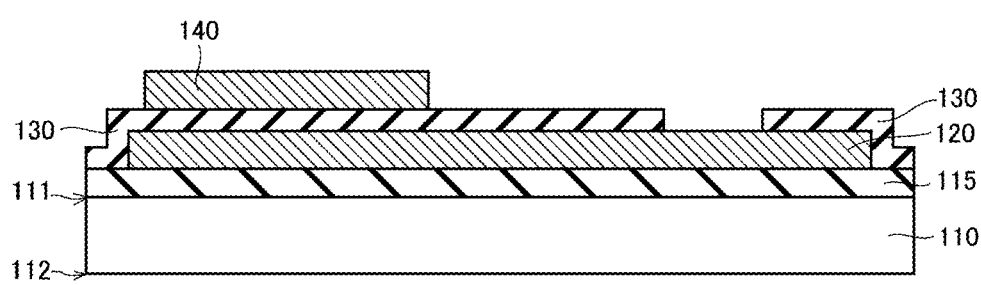
FIG. 9 is a sectional view illustrating a state in which a through-hole is formed in the dielectric layer, in the method for manufacturing the capacitor according to Embodiment 1 of the present invention.

FIG. 9 is a sectional view illustrating a state in which the through-hole is formed in the dielectric layer, in the method for manufacturing the capacitor according to Embodiment 1 of the present invention. As illustrated in FIG. 9, by etching part of the dielectric layer 130, the through-hole is formed in the dielectric layer 130.

Figure 10:
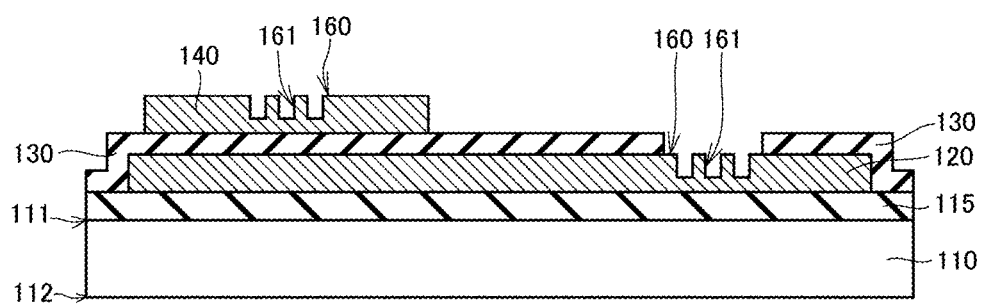
FIG. 10 is a sectional view illustrating a state in which a first uneven surface portion is formed in each of the first electrode layer and the second electrode layer, in the method for manufacturing the capacitor according to Embodiment 1 of the present invention.

FIG. 10 is a sectional view illustrating a state in which the first uneven surface portion is formed in each of the first electrode layer and the second electrode layer, in the method for manufacturing the capacitor according to Embodiment 1 of the present invention. As illustrated in FIG. 10, the first uneven surface portion 161 is formed by etching part of each of the first electrode layer 120 and the second electrode layer 140. In the present embodiment, the first uneven surface portion 161 is formed in each of the first electrode layer 120 and the second electrode layer 140, but the present invention is not limited thereto, and the first uneven surface portion 161 may be formed by etching at least one of the first electrode layer 120 and the second electrode layer 140.

Figure 11:
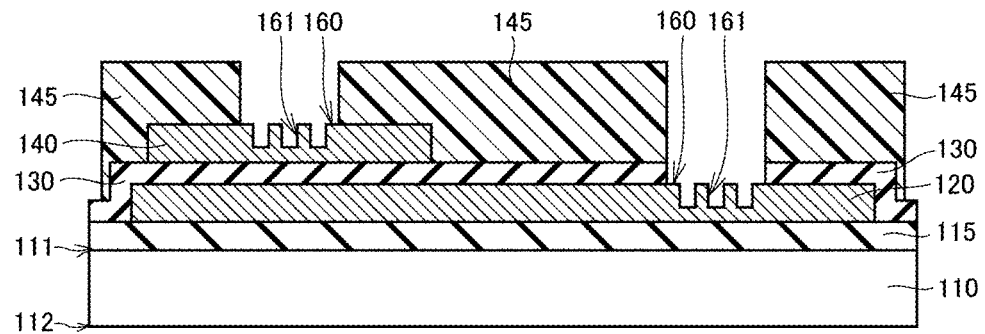
FIG. 11 is a sectional view illustrating a state in which a protective layer is provided, in the method for manufacturing the capacitor according to Embodiment 1 of the present invention.

FIG. 11 is a sectional view illustrating a state in which the protective layer is provided, in the method for manufacturing the capacitor according to Embodiment 1 of the present invention. As illustrated in FIG. 11, the protective layer 145 provided so as to cover a side of the first main surface 111 of the substrate 110 is patterned such that the first contact surface 160 is exposed, by a photolithography method. Specifically, first, the protective layer 145 is laminated on a side opposite to a substrate side of each of the dielectric layer 130, the first electrode layer 120, and the second electrode layer 140. Then, a resist pattern is formed on the protective layer 145, and the protective layer 145 is etched using the resist pattern as a mask, to pattern the protective layer 145. When the protective layer 145 is formed of a photosensitive material, the protective layer 145 is laminated, and then exposed and developed by a photolithography method, to pattern the protective layer 145.

Next, the outer electrodes 150 are provided so as to correspond and connect to each of the first uneven surface portion 161 of the first electrode layer 120 and the first uneven surface portion 161 of the second electrode layer 140, by a lift-off method, a plating method, an etching method, or the like. In the present embodiment, the outer electrodes 150 are provided on the first uneven surface portion 161 of each of the first electrode layer 120 and the second electrode layer 140, and on part on a side opposite to a substrate side of the protective layer 145. By the above steps, the capacitor 100 according to Embodiment 1 of the present invention as illustrated in FIG. 1 is manufactured.

Note that, in the method for manufacturing the capacitor 100 according to the present embodiment, a plurality of the capacitors 100 may be collectively manufactured on a mother substrate by the above-described method for manufacturing. In this case, the method for manufacturing the capacitor 100 according to the present embodiment may include at least one of a back grinding step of grinding a second main surface 112 on a side opposite to the first main surface 111 of the substrate 110 in order to adjust the thickness of the substrate 110, and a step of separating the mother substrate into the plurality of capacitors 100 by blade dicing, stealth dicing, plasma dicing, or the like.

As described above, in the capacitor 100 according to the present embodiment, at least one of the first electrode layer 120 and the second electrode layer 140, and the outer electrode 150 are in contact with each other at the first contact surface 160, and the first contact surface 160 includes the first uneven surface portion 161, and thus an area of the first contact surface 160 increases, and contact resistance decreases. As a result, ESR of the capacitor 100 can be reduced, and a Q value of the capacitor 100 can be increased.

Embodiment 2

Hereinafter, a capacitor according to Embodiment 2 of the present invention will be described. The capacitor according to Embodiment 2 of the present invention is different from the capacitor 100 according to Embodiment 1 of the present invention mainly in that a second contact surface between a first electrode layer and a dielectric layer, and a third contact surface between the dielectric layer and a second electrode layer have a second uneven surface portion and a third uneven surface portion, respectively. Thus, description of the same configuration as that of the capacitor 100 according to Embodiment 1 of the present invention will not be repeated.

Figure 12:
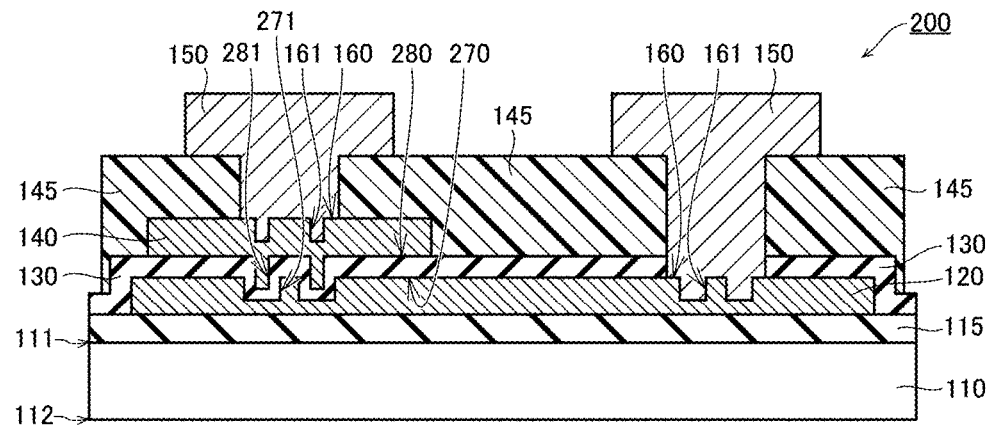
FIG. 12 is a sectional view of a capacitor according to Embodiment 2 of the present invention.

FIG. 12 is a sectional view of the capacitor according to Embodiment 2 of the present invention. As illustrated in FIG. 12, a second contact surface 270 between the first electrode layer 120 and the dielectric layer 130 includes a second uneven surface portion 271.

As illustrated in FIG. 12, the second uneven surface portion 271 is constituted by a plurality of recessed portions formed in the first electrode layer 120, but may be constituted by a plurality of protruding portions formed on the first electrode layer 120. Note that, the width of each of the plurality of recessed portions constituting the second uneven surface portion 271 is preferably equal to or larger than 6 μm. This is because when the width of each of the plurality of recessed portions is smaller than 6 μm, there is a possibility that a thickness dimension of each layer is limited, or a defect occurs in a film formation process.

A depth of each of the recessed portions constituting the second uneven surface portion 271 is preferably 0.2 μm to 4 μm. In addition, the depth of each of the recessed portions constituting the second uneven surface portion 271 is preferably equal to or smaller than 0.5 times a thickness of the first electrode layer 120. When the depth of each of the recessed portions constituting the second uneven surface portion 271 exceeds 0.5 times the thickness of the first electrode layer 120, there is a possibility that a process margin in an unevenness processing cannot be sufficiently secured, and thus a desired shape of a recessed portion cannot be obtained, for example, a bottom of the recessed portion is penetrated.

As illustrated in FIG. 12, a third contact surface 280 between the dielectric layer 130 and the second electrode layer 140 includes a third uneven surface portion 281. The third uneven surface portion 281 is constituted by a plurality of recessed portions formed in the dielectric layer 130. Note that, when the second uneven surface portion 271 is constituted by a plurality of protrusions formed on the first electrode layer 120, the third uneven surface portion 281 may be constituted by a plurality of protruding portions formed on the dielectric layer 130.

When viewed from a side of the outer electrodes 150, at least part of the second uneven surface portion 271 overlaps with the third uneven surface portion 281. Further, the third uneven surface portion 281 of the third contact surface 280 between the dielectric layer 130 and the second electrode layer 140 is formed along the second uneven surface portion 271 of the second contact surface 270 between the first electrode layer 120 and the dielectric layer 130. A part of the third uneven surface portion 281 that is closest to the second main surface 112 is located closer to the second main surface 112 than a part of the second uneven surface portion 271 that is farthest from the second main surface 112. In the present embodiment, the plurality of recessed portions formed in the dielectric layer 130 are located along the plurality of recessed portions formed in the first electrode layer 120 respectively, and thus the second uneven surface portion 271 of the second contact surface 270 between the first electrode layer 120 and the dielectric layer 130, and the third uneven surface portion 281 of the third contact surface 280 between the dielectric layer 130 and the second electrode layer 140 are located so as to mesh with each other.

Hereinafter, a method for manufacturing the capacitor according to Embodiment 2 of the present invention will be described.

In manufacturing a capacitor 200 according to the present embodiment, the first electrode layer 120 is provided on a side of the first main surface of the substrate 110, in the same manner as in the manufacturing of the capacitor 100 according to Embodiment 1.

Figure 13:
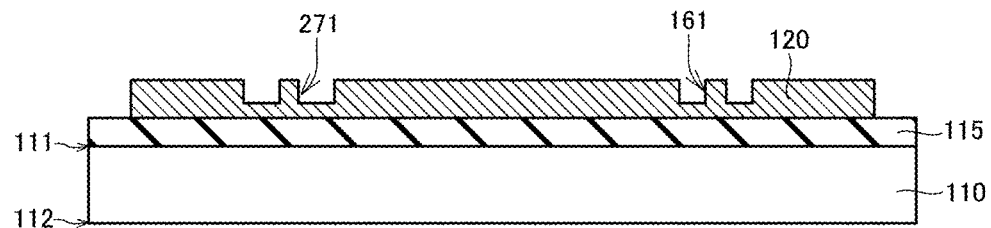
FIG. 13 is a sectional view illustrating a state in which a first uneven surface portion and a second uneven surface portion are formed in a first electrode layer, in a method for manufacturing the capacitor according to Embodiment 2 of the present invention.

FIG. 13 is a sectional view illustrating a state in which the first uneven surface portion and the second uneven surface portion are formed in the first electrode layer, in the method for manufacturing the capacitor according to Embodiment 2 of the present invention. As illustrated in FIG. 13, part of the first electrode layer 120 is subjected to dry etching, thereby forming the first uneven surface portion 161 and the second uneven surface portion 271 on respective parts on a side opposite to a substrate side of the first electrode layer 120.

Figure 14:
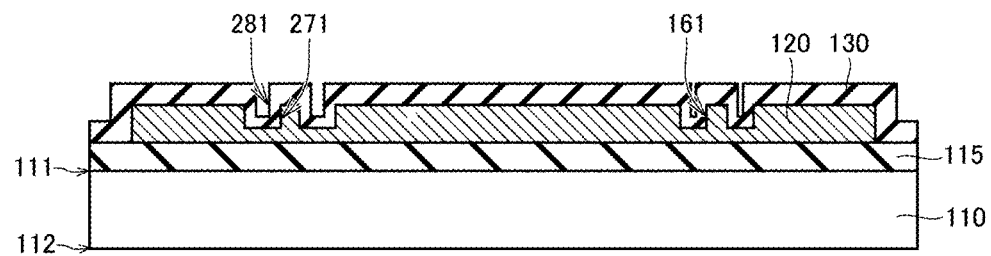
FIG. 14 is a sectional view illustrating a state in which a dielectric layer is provided on the first electrode layer, in the method for manufacturing the capacitor according to Embodiment 2 of the present invention.

FIG. 14 is a sectional view illustrating a state in which the dielectric layer is provided on the first electrode layer, in the method for manufacturing the capacitor according to Embodiment 2 of the present invention. As illustrated in FIG. 14, by laminating the dielectric layer 130 on at least the second uneven surface portion 271 of the first electrode layer 120 by a CVD method, a PVD method, or the like, the third uneven surface portion 281 is formed on part on a side opposite to a substrate side of the dielectric layer 130. In the manufacturing method of the present embodiment, the dielectric layer 130 is laminated on the entire first electrode layer 120, and then the dielectric layer 130 is etched. By forming the third uneven surface portion 281 as described above, the second uneven surface portion 271 of the second contact surface 270, and the third uneven surface portion 281 of the third contact surface 280 are located so as to mesh with each other.

Figure 15:
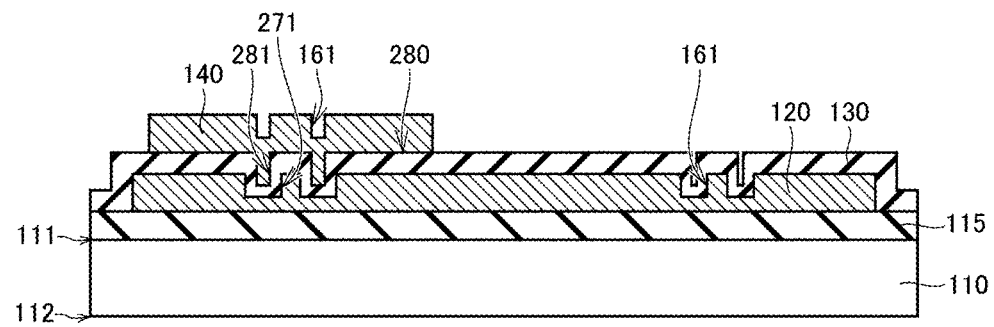
FIG. 15 is a sectional view illustrating a state in which a second electrode layer is provided on the dielectric layer in the method for manufacturing the capacitor according to Embodiment 2 of the present invention.

FIG. 15 is a sectional view illustrating a state in which the second electrode layer is provided on the dielectric layer, in the method for manufacturing the capacitor according to Embodiment 2 of the present invention. As illustrated in FIG. 15, the second electrode layer 140 is laminated on at least the third uneven surface portion 281 of the dielectric layer 130, by a lift-off method, a plating method, or the like. By laminating the second electrode layer 140 in this manner, the first uneven surface portion 161 is formed on at least part on a side opposite to a substrate side of the second electrode layer 140.

Figure 16:
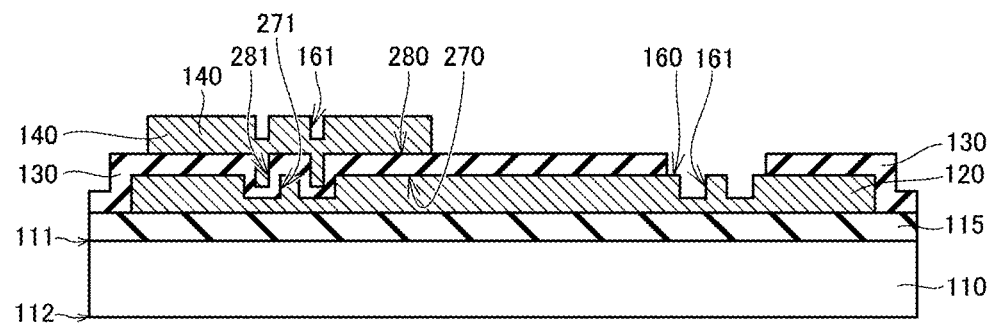
FIG. 16 is a sectional view illustrating a state in which a through-hole is formed in the dielectric layer, in the method for manufacturing the capacitor according to Embodiment 2 of the present invention.

FIG. 16 is a sectional view illustrating a state in which a through-hole is formed in the dielectric layer, in the method for manufacturing the capacitor according to Embodiment 2 of the present invention. As illustrated in FIG. 16, by etching part of the dielectric layer 130, the through-hole for connecting the first electrode layer 120 to the outer electrode 150 is formed.

Figure 17:
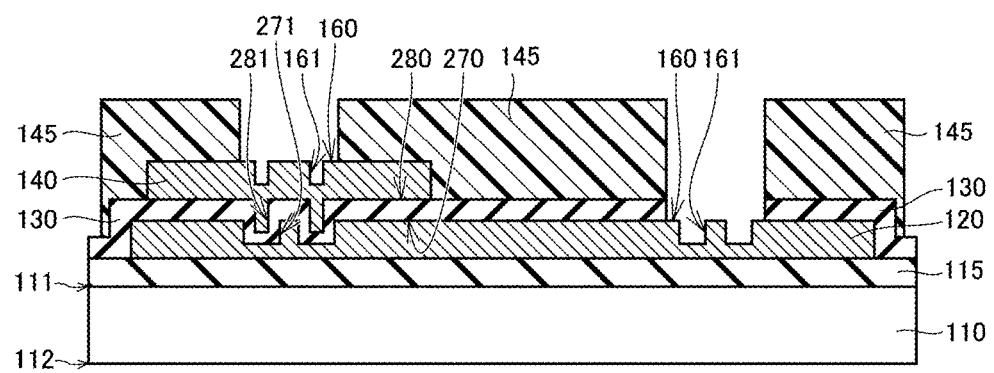
FIG. 17 is a sectional view illustrating a state in which a protective layer is provided, in the method for manufacturing the capacitor according to Embodiment 2 of the present invention.

FIG. 17 is a sectional view illustrating a state in which a protective layer is provided in the method for manufacturing the capacitor according to Embodiment 2 of the present invention. As illustrated in FIG. 17, the protective layer 145 provided so as to cover a side of the first main surface 111 of the substrate 110 is patterned such that the first contact surface 160 is exposed, by a photolithography method. Specifically, first, the protective layer 145 is laminated on a side opposite to a substrate side of each of the dielectric layer 130, the first electrode layer 120, and the second electrode layer 140. Then, a resist pattern is formed on the protective layer 145, and the protective layer 145 is etched using the resist pattern as a mask, to pattern the protective layer 145.

Next, the outer electrode 150 is provided so as to correspond and connect to each of the first uneven surface portion 161 of the first electrode layer 120 and the first uneven surface portion 161 of the second electrode layer 140, by a lift-off method, a plating method, an etching method, or the like. In the present embodiment, the outer electrode 150 is provided on the first uneven surface portion 161 of each of the first electrode layer 120 and the second electrode layer 140, and on part on a side opposite to a substrate side of the protective layer 145. By the above steps, the capacitor 200 according to Embodiment 2 of the present invention as illustrated in FIG. 12 is manufactured.

As described above, in the capacitor 200 according to the present embodiment, when viewed from a side of the outer electrode 150, at least part of the second uneven surface portion 271 overlaps with the third uneven surface portion 281. Further, a part of the third uneven surface portion 281 that is closest to the second main surface 112 is located closer to the second main surface 112 than a part of the second uneven surface portion 271 that is farthest from the second main surface 112, and thus, an opposing area between the first electrode layer 120 and the second electrode layer 140 increases. Thus, electrostatic capacity of the capacitor 200 can be increased.

In addition, in the method for manufacturing the capacitor 200 according to the present embodiment, the third uneven surface portion 281 is naturally formed by laminating the dielectric layer 130 on at least the second uneven surface portion 271 of the first electrode layer 120, thus a separate step of forming the third uneven surface portion 281 is not required after the step of laminating the dielectric layer 130. Further, since the first uneven surface portion 161 is naturally formed by laminating the second electrode layer 140 on at least the third uneven surface portion 281 of the dielectric layer 130, a separate step of forming the first uneven surface portion 161 is not necessary after a step of laminating the second electrode layer 140. That is, by a simple manufacturing method, the opposing area between the first electrode layer 120 and the second electrode layer 140 can be increased to increase the electrostatic capacity of the capacitor 200, and an area of the first contact surface 160 between the second electrode layer 140 and the outer electrode 150 can be increased to decrease the contact resistance, thereby reducing ESR and increasing a Q value of the capacitor 200.

Note that, in the method for manufacturing the capacitor 200 according to the present embodiment, in the step of forming the second uneven surface portion 271, part of the first electrode layer 120 may be subjected to wet etching instead of the dry etching. Here, a modified example of the method for manufacturing the capacitor 200 according to the present embodiment will be described.

Figure 18:
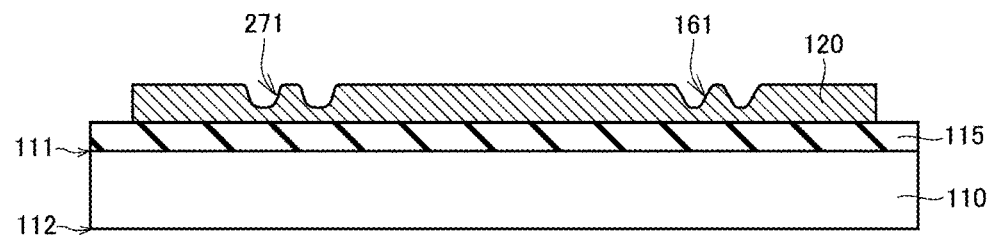
FIG. 18 is a sectional view illustrating a state in which part of a first electrode layer is subjected to wet etching, when a capacitor according to a modified example of Embodiment 2 of the present invention is manufactured.
Figure 19:
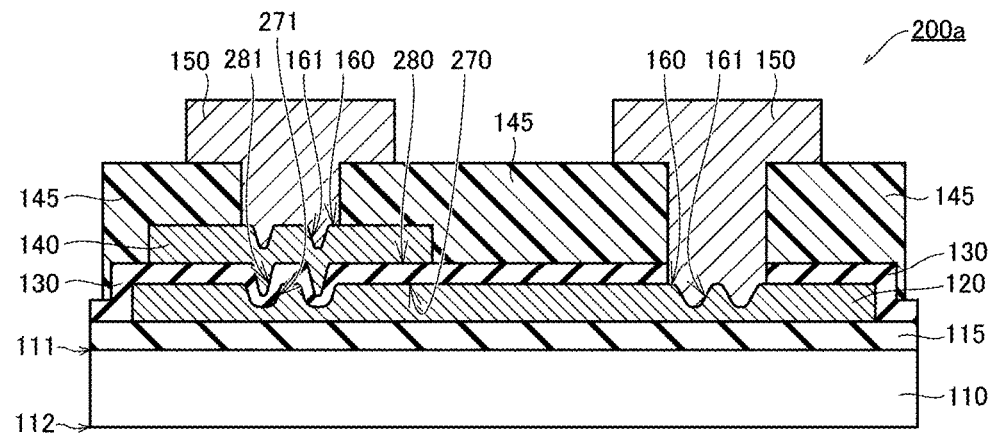
FIG. 19 is a sectional view of the capacitor according to the modified example of Embodiment 2 of the present invention.

FIG. 18 is a sectional view illustrating a state in which part of a first electrode layer is subjected to wet etching, when a capacitor according to the modified example of Embodiment 2 of the present invention is manufactured. FIG. 19 is a sectional view of the capacitor according to the modified example of Embodiment 2 of the present invention.

In the present modified example, in a step of forming the second uneven surface portion 271, the first electrode layer 120 is subjected to wet etching. As illustrated in FIG. 18, by the wet etching, in the first electrode layer 120, the first uneven surface portion 161 and the second uneven surface portion 271 made of the first electrode layer 120 are formed. Each of the first uneven surface portion 161 and the second uneven surface portion 271 is constituted by a plurality of recessed portions formed in the first electrode layer 120. Corner portions of each of the plurality of recessed portions formed by the wet etching are each rounded, and a peripheral wall of each of the plurality of recessed portions is inclined in a tapered shape toward the bottom.

The third uneven surface portion 281 of a capacitor 200a according to the present modified example is formed in the same manner as the method for manufacturing the capacitor 200 according to Embodiment 2. As illustrated in FIG. 19, the third uneven surface portion 281 of the capacitor 200a is located so as to mesh with the second uneven surface portion 271. In the present modified example, corner portions of each of the plurality of recessed portions formed in the dielectric layer 130 constituting the third uneven surface portion 281 are each rounded, and a peripheral wall of each of the plurality of recessed portions is inclined in a tapered shape toward the bottom.

Further, as illustrated in FIG. 19, when the capacitor 200a is viewed from a side of the outer electrodes 150, the first uneven surface portion 161 formed of the second electrode layer 140 is located so as to overlap with the third uneven surface portion 281. Further, corner portions of each of the plurality of recessed portions formed in the second electrode layer 140 constituting the first uneven surface portion 161 are each rounded, and a peripheral wall of each of the plurality of recessed portions is formed in a tapered shape toward the bottom.

As described above, in the step of forming the second uneven surface portion 271, by performing the wet etching for the first electrode layer 120, in the capacitor 100a according to the present modified example, the corner portion of each of the first uneven surface portion 161, the second uneven surface portion 271, and the third uneven surface portion 281 has a rounding shape, and the peripheral wall of each of the first uneven surface portion 161, the second uneven surface portion 271, and the third uneven surface portion 281 is inclined in the tapered shape toward the bottom. Accordingly, electric field concentration in each of the corner portions of the second uneven surface portion 271 and the corner portions of the third uneven surface portion 281 in the dielectric layer 130 is reduced, and thus the capacitor 200a according to the present modified example has improved pressure resistance performance. Note that, it is sufficient that at least one condition is satisfied of either a condition that the corner portion of each of the second uneven surface portion 271 and the third uneven surface portion 281 has the rounding shape, or a condition that the peripheral wall of each of the second uneven surface portion 271 and the third uneven surface portion 281 is inclined in the tapered shape toward the bottom. Under the at least one condition, the electric field concentration in each of the corner portions of the second uneven surface portion 271 and the corner portions of the third uneven surface portion 281 in the dielectric layer 130 can be reduced.

Embodiment 3

Hereinafter, a capacitor according to Embodiment 3 of the present invention will be described. The capacitor according to Embodiment 3 of the present invention is different from the capacitor 200 according to Embodiment 2 of the present invention mainly in that, a plurality of recessed portions are formed in the first main surface of the substrate. Thus, description of the same configuration as that of the capacitor 200 according to Embodiment 2 of the present invention will not be repeated.

Figure 20:
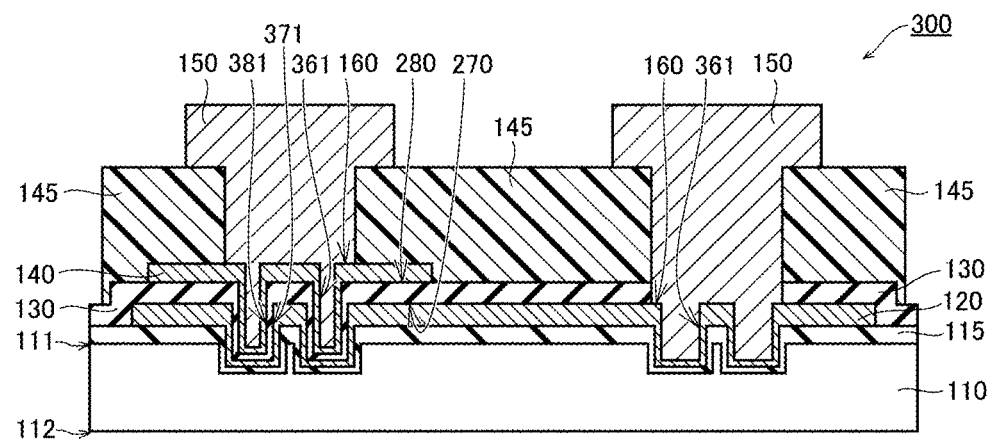
FIG. 20 is a sectional view of a capacitor according to Embodiment 3 of the present invention.

FIG. 20 is a sectional view of the capacitor according to Embodiment 3 of the present invention.

As illustrated in FIG. 20, a plurality of recessed portions are formed in the first main surface 111 of the substrate 110. The depth of the recessed portion is preferably 0.2 µm to 6 µm. When the depth of the recessed portion is smaller than 0.2 µm, there is a possibility that an effect due to the formation of the plurality of recessed portions in the first main surface 111 is not sufficiently obtained, and when the depth of the recessed portion is larger than 6 µm, there is a possibility that a defect occurs in a film forming process. The width of each of the plurality of recessed portions is preferably equal to or larger than 12 µm. This is because when the width of each of the plurality of recessed portions is smaller than 12 µm, there is a possibility that a thickness dimension of each layer is limited, or a defect occurs in a film formation process. In the present embodiment, when the recessed portions are formed in the first main surface, inner surfaces of each of the plurality of recessed portions are not considered part of the first main surface 111.

In the present embodiment, the insulating layer 115 is laminated along the first main surface 111 of the substrate 110 and the inner surface of each of the plurality of recessed portions. At least part of a contact surface between the substrate 110 and the insulating layer 115 is located closer to the second main surface 112 than the first main surface 111.

As illustrated in FIG. 20, in the present embodiment, the first electrode layer 120 is laminated on a side opposite to a substrate side of the insulating layer 115, so as to extend along the first main surface 111 of the substrate 110 and the inner surface of each of the plurality of recessed portions. By laminating the first electrode layer 120 as described above, at least part of a second uneven surface portions 371 of the second contact surface 270 between the first electrode layer 120 and the dielectric layer 130 is located closer to the second main surface 112 than the first main surface 111.

Since at least the part of the second uneven surface portion 371 is located as described above, a depth dimension of each of the plurality of recessed portions constituting the second uneven surface portion 371 in the present embodiment may be larger than a thickness dimension of the first electrode layer 120.

Additionally, as illustrated in FIG. 20, a depth dimension of each of the plurality of recessed portions constituting a third uneven surface portion 381 of the third contact surface 280 between the dielectric layer 130 and the second electrode layer 140 in the present embodiment may be larger than a thickness dimension of the second electrode layer 140.

Further, in the present embodiment, the first electrode layer 120 and the outer electrode 150 are in contact with each other at the first contact surface 160. The first contact surface 160 includes a first uneven surface portion 361, and at least part of the first uneven surface portion 361 of the first contact surface 160 between the first electrode layer 120 and the outer electrode 150 is located closer to the second main surface 112 than the first main surface 111.

Since at least the part of the first uneven surface portion 361 in the first contact surface 160 between the first electrode layer 120 and the outer electrode 150 is located as described above, a depth dimension of each of the plurality of recessed portions constituting the first uneven surface portion 361 of the first contact surface 160 between the first electrode layer 120 and the outer electrode 150 in the present embodiment may be larger than a thickness dimension of the first electrode layer 120.

Hereinafter, a method for manufacturing a capacitor 300 according to Embodiment 3 of the present invention will be described.

Figure 21:
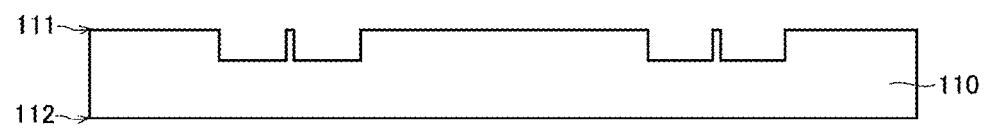
FIG. 21 is a sectional view illustrating a state in which a plurality of recessed portions are provided in a substrate, in a method for manufacturing the capacitor according to Embodiment 3 of the present invention.

FIG. 21 is a sectional view illustrating a state in which the plurality of recessed portions are provided in the substrate, in the method for manufacturing the capacitor according to Embodiment 3 of the present invention. When manufacturing the capacitor 300 according to the present embodiment, as illustrated in FIG. 21, first, the plurality of recessed portions are provided in the first main surface 111 of the substrate 110 by an etching method.

Figure 22:
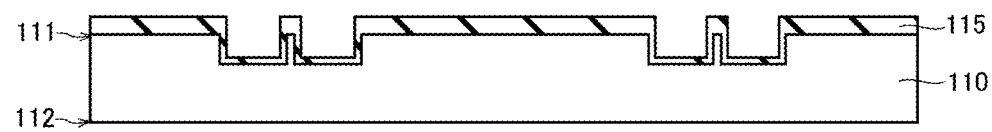
FIG. 22 is a sectional view illustrating a state in which an insulating layer is provided on a first main surface of the substrate, in the method for manufacturing the capacitor according to Embodiment 3 of the present invention.

FIG. 22 is a sectional view illustrating a state in which the insulating layer is provided on the first main surface of the substrate and within the plurality of recessed portions, in the method for manufacturing the capacitor according to Embodiment 3 of the present invention. As illustrated in FIG. 22, the insulating layer 115 is provided on the first main surface of the substrate 110 and within the plurality of recessed portions by a CVD method, a PVD method, or the like.

Figure 23:
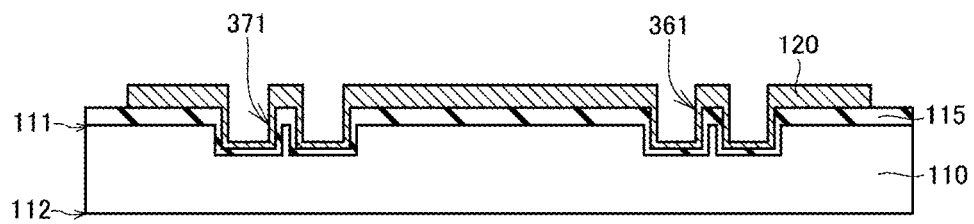
FIG. 23 is a sectional view illustrating a state in which a first electrode layer is provided on the insulating layer, in the method for manufacturing the capacitor according to Embodiment 3 of the present invention.

FIG. 23 is a sectional view illustrating a state in which the first electrode layer is provided on the insulating layer, in the method for manufacturing the capacitor according to Embodiment 3 of the present invention. As illustrated in FIG. 23, the first electrode layer 120 is provided on the side opposite to the substrate side of the insulating layer 115, by a lift-off method, a plating method, an etching method, or the like. That is, the first electrode layer 120 is provided on a side of the first main surface of the substrate 110. In the first electrode layer 120, each of the first uneven surface portion 361 and the second uneven surface portion 371 is formed so as to be along a shape of the recessed portions of the substrate 110.

Figure 24:
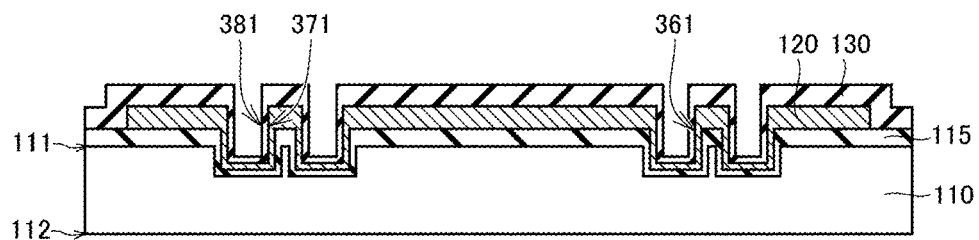
FIG. 24 is a sectional view illustrating a state in which a dielectric layer is provided on the first electrode layer, in the method for manufacturing the capacitor according to Embodiment 3 of the present invention.

FIG. 24 is a sectional view illustrating a state in which the dielectric layer is provided on the first electrode layer, in the method for manufacturing the capacitor according to Embodiment 3 of the present invention. As illustrated in FIG. 24, by laminating the dielectric layer 130 on at least the second uneven surface portion 371 of the first electrode layer 120 by a CVD method, a PVD method, or the like, the third uneven surface portion 381 is formed on part on a side opposite to a substrate side of the dielectric layer 130.

Figure 25:
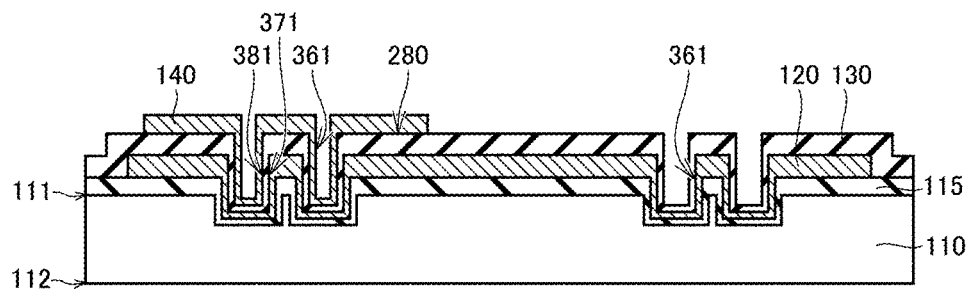
FIG. 25 is a sectional view illustrating a state in which a second electrode layer is provided on the dielectric layer, in the method for manufacturing the capacitor according to Embodiment 3 of the present invention.

FIG. 25 is a sectional view illustrating a state in which the second electrode layer is provided on the dielectric layer, in the method for manufacturing the capacitor according to Embodiment 3 of the present invention. As illustrated in FIG. 25, the second electrode layer 140 is laminated on at least the third uneven surface portion 381 of the dielectric layer 130, by a lift-off method, a plating method, an etching method, or the like. By laminating the second electrode layer 140 in this manner, the first uneven surface portion 361 is formed on at least part on a side opposite to a substrate side of the second electrode layer 140.

Figure 26:
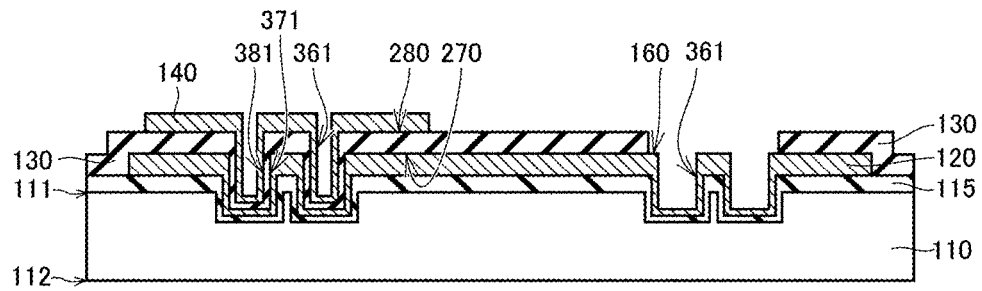
FIG. 26 is a sectional view illustrating a state in which a through-hole is formed in the dielectric layer, in the method for manufacturing the capacitor according to Embodiment 3 of the present invention.

FIG. 26 is a sectional view illustrating a state in which a through-hole is formed in the dielectric layer, in the method for manufacturing the capacitor according to Embodiment 3 of the present invention. As illustrated in FIG. 26, by etching part of the dielectric layer 130, the through-hole for connecting the first electrode layer 120 to the outer electrode 150 is formed.

Figure 27:
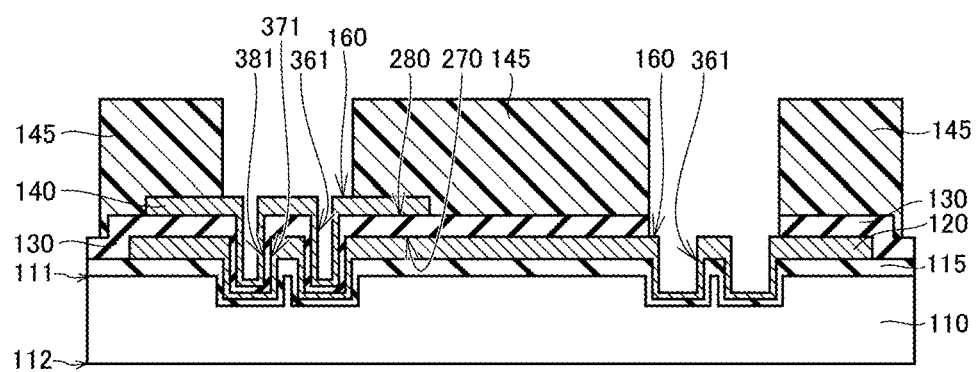
FIG. 27 is a sectional view illustrating a state in which a protective layer is provided, in the method for manufacturing the capacitor according to Embodiment 3 of the present invention.

FIG. 27 is a sectional view illustrating a state in which a protective layer is provided, in the method for manufacturing the capacitor according to Embodiment 3 of the present invention. As illustrated in FIG. 27, the protective layer 145 provided so as to cover a side of the first main surface 111 of the substrate 110 is patterned such that the first contact surface 160 is exposed, by a photolithography method. Specifically, first, the protective layer 145 is laminated on a side opposite to a substrate side of each of the dielectric layer 130, the first electrode layer 120, and the second electrode layer 140. Then, a resist pattern is formed on the protective layer 145, and the protective layer 145 is etched using the resist pattern as a mask, to pattern the protective layer 145.

Next, the outer electrode 150 is provided so as to correspond and connect to each of the first uneven surface portion 361 of the first electrode layer 120 and the first uneven surface portion 361 of the second electrode layer 140, by a lift-off method, a plating method, an etching method, or the like. In the present embodiment, the outer electrode 150 is provided on the first uneven surface portion 361 of each of the first electrode layer 120 and the second electrode layer 140, and on part on a side opposite to a substrate side of the protective layer 145. By the above steps, the capacitor 300 according to Embodiment 3 of the present invention as illustrated in FIG. 20 is manufactured.

As described above, in the capacitor 300 according to the embodiment, at least the part of the second uneven surface portion 371 of the second contact surface 270 between the first electrode layer 120 and the dielectric layer 130 is located closer to the second main surface 112 than the first main surface 111, and thus the depth dimension of each of the plurality of recessed portions constituting the second uneven surface portion 371 can be further increased without being limited by the thickness of the first electrode layer 120. Further, by further increasing the depth dimension of each of the plurality of recessed portions constituting the second uneven surface portion 371, the depth dimension of each of the plurality of recessed portions constituting the third uneven surface portion 381 can be further increased. As a result, an opposing area between the first electrode layer 120 and the second electrode layer 140 can be further increased, and thus electrostatic capacity of the capacitor 300 can be further increased.

In addition, in the capacitor 300 according to the embodiment, at least the part of the first uneven surface portion 361 of the first contact surface 160 between the first electrode layer 120 and the outer electrode 150 is located closer to the second main surface 112 than the first main surface 111, thus, the depth dimension of each of the plurality of recessed portions constituting the first uneven surface portion 361 can be further increased without being limited by the thickness of the first electrode layer 120. As a result, contact resistance in the first contact surface 160 can be further reduced, thus ESR of the capacitor 300 can be further reduced, and a Q value of the capacitor 300 can be further increased.

In the description of the above-described embodiments, combinable configurations may be combined with each other.

It should be considered that the embodiments disclosed herein are illustrative in all respects and are not restrictive. The scope of the present invention is indicated by the appended claims rather than by the above description, and it is intended that all modifications within the meaning and scope equivalent to those of the claims are included.

REFERENCE SIGNS LIST 100, 100b, 100c, 200, 200a, 300 CAPACITOR
110 SUBSTRATE
111 FIRST MAIN SURFACE
112 SECOND MAIN SURFACE
115 INSULATING LAYER
120 FIRST ELECTRODE LAYER
130 DIELECTRIC LAYER
140 SECOND ELECTRODE LAYER
145 PROTECTIVE LAYER
150 OUTER ELECTRODE
160 FIRST CONTACT SURFACE
161, 361 FIRST UNEVEN SURFACE PORTION
164a, 164b, 164c FIRST UNEVEN PATTERN
165a, 165b, 165c SECOND UNEVEN PATTERN
270 SECOND CONTACT SURFACE
271, 371 SECOND UNEVEN SURFACE PORTION
280 THIRD CONTACT SURFACE
281, 381 THIRD UNEVEN SURFACE PORTION

The invention claimed is:

1. A capacitor, comprising:
a substrate having a first main surface and a second main surface on a side thereof opposite to the first main surface;
a first electrode layer on a side of the first main surface of the substrate;
a dielectric layer on at least part of the first electrode layer;
a second electrode layer on at least part of the dielectric layer;
a first outer electrode electrically connected to the first electrode layer; and
a second outer electrode electrically connected to the second electrode layer, wherein
at least one of (1) the first electrode layer and the first outer electrode and (2) the second electrode layer and the second outer electrode are in contact with each other at a first contact surface, and the first contact surface includes a first uneven surface portion, the first electrode layer and the dielectric layer are in contact with each other at a second contact surface, and the second contact surface includes a second uneven surface portion, the dielectric layer and the second electrode layer are in contact with each other at a third contact surface, and the third contact surface includes a third uneven surface portion, at least part of the second uneven surface portion overlaps with the third uneven surface portion when viewed from a side of the capacitor having the first and second outer electrodes, and a part of the third uneven surface portion that is closest to the second main surface is located closer to the second main surface than a part of the second uneven surface portion that is farthest from the second main surface.

2. The capacitor according to claim 1, wherein the second uneven surface portion comprises a plurality of recessed portions in the first electrode layer.

3. The capacitor according to claim 2, wherein a width of each of the plurality of recessed portions is equal to or larger than 6 μm.

4. The capacitor according to claim 2, wherein a depth of each of the plurality of recessed portions is 0.2 μm to 4 μm.

5. The capacitor according to claim 1, wherein the third uneven surface portion comprises a plurality of recessed portions in the dielectric layer.

6. The capacitor according to claim 1, wherein
at least one of (1) a corner portion of each of the first uneven surface portion, the second uneven surface portion, and the third uneven surface portion has a round shape, or (2) a peripheral wall of each of the first uneven surface portion, the second uneven surface portion, and the third uneven surface portion is inclined in a tapered shape toward a bottom thereof.

7. The capacitor according to claim 1, wherein
at least part of the second uneven surface portion is located closer to the second main surface than the first main surface.

8. A capacitor, comprising:
a substrate having a first main surface and a second main surface on a side thereof opposite to the first main surface;
a first electrode layer on a side of the first main surface of the substrate;
a dielectric layer on at least part of the first electrode layer;
a second electrode layer on at least part of the dielectric layer;
a first outer electrode electrically connected to the first electrode layer; and
a second outer electrode electrically connected to the second electrode layer, wherein
at least one of (1) the first electrode layer and the first outer electrode and (2) the second electrode layer and the second outer electrode are in contact with each other at a first contact surface, and the first contact surface includes a first uneven surface portion,
the first uneven surface portion comprises a plurality of recessed portions, and
a width of each of the plurality of recessed portions is equal to or larger than 3 μm.

9. The capacitor according to claim 8, wherein
the first contact surface is between the first electrode layer and the first outer electrode and includes the first uneven surface portion, and at least part of the first uneven surface portion is located closer to the second main surface than the first main surface.

10. The capacitor according to claim 8, wherein
both of (1) the first electrode layer and the first outer electrode and (2) the second electrode layer and the second outer electrode are in contact with each other at a respective first contact surface.

11. The capacitor according to claim 10, wherein
the first uneven surface portion of the respective first contact surface between the first electrode layer and the first outer electrode has a first uneven pattern, and
the first uneven surface portion of the respective first contact surface between the second electrode layer and the second outer electrode has a second uneven pattern different from the first uneven pattern.

12. A capacitor, comprising:
a substrate having a first main surface and a second main surface on a side thereof opposite to the first main surface;
a first electrode layer on a side of the first main surface of the substrate;
a dielectric layer on at least part of the first electrode layer;
a second electrode layer on at least part of the dielectric layer;
a first outer electrode electrically connected to the first electrode layer; and
a second outer electrode electrically connected to the second electrode layer, wherein
at least one of (1) the first electrode layer and the first outer electrode and (2) the second electrode layer and the second outer electrode are in contact with each other at a first contact surface, and the first contact surface includes a first uneven surface portion, and
a depth of each of the plurality of recessed portions is 0.2 μm to 2 μm.

13. A capacitor, comprising:
a substrate having a first main surface and a second main surface on a side thereof opposite to the first main surface;
a first electrode layer on a side of the first main surface of the substrate;
a dielectric layer on at least part of the first electrode layer;
a second electrode layer on at least part of the dielectric layer;
a first outer electrode electrically connected to the first electrode layer; and
a second outer electrode electrically connected to the second electrode layer, wherein
at least one of (1) the first electrode layer and the first outer electrode and (2) the second electrode layer and the second outer electrode are in contact with each other at a first contact surface, and the first contact surface includes a first uneven surface portion, and
the first main surface of the substrate includes a plurality of recessed portions at a location corresponding to the first contact surface.

14. The capacitor according to claim 13, wherein a width of each of the plurality of recessed portions is equal to or larger than 12 μm.

15. The capacitor according to claim 13, wherein a depth of each of the plurality of recessed portions is 0.2 μm to 6 μm.

16. A method for manufacturing a capacitor, the method comprising:

providing a first electrode layer on a side of a first main surface of a substrate;
forming a first uneven surface portion on at least part of a side of the first electrode layer opposite to the substrate;
forming a dielectric layer on the first electrode layer other than at a location corresponding to the first uneven surface portion;
laminating a second electrode layer on the dielectric layer so as to not overlap the first uneven surface portion; and
electrically connecting a first outer electrode to the first electrode layer via the first uneven surface portion; and
electrically connecting a second outer electrode to the second electrode layer.

17. The method of manufacturing a capacitor according to claim 16, further comprising:
forming a second uneven surface portion on at least part of a side of the second electrode layer opposite to the substrate; and
electrically connecting the second outer electrode to the second electrode layer via the second uneven surface portion.

18. A method for manufacturing a capacitor, the method comprising:
providing a first electrode layer on a side of a first main surface of a substrate;
forming a first uneven surface portion and a second uneven surface portion on a side of the first electrode layer opposite to the substrate;
laminating a dielectric layer on at least the second uneven surface portion of the first electrode layer to form a third uneven surface portion on a side of the dielectric layer opposite to the substrate;
laminating a second electrode layer on at least the third uneven surface portion of the dielectric layer to form a fourth uneven surface portion on a side of the second electrode layer opposite to the substrate;
electrically connecting a first outer electrode to the first electrode layer via the first uneven surface portion; and
electrically connecting a second outer electrode to the second electrode layer via the fourth uneven surface portion.

* * * * *